(12) United States Patent
Haschka et al.

(10) Patent No.: US 10,539,946 B2
(45) Date of Patent: Jan. 21, 2020

(54) CLOSED-LOOP CONTROL DEVICE WITH ADAPTIVE FAULT COMPENSATION

(71) Applicant: SIEMENS AKTIENGESELLSCHAFT, München (DE)

(72) Inventors: Markus Stephan Haschka, Nürnberg (DE); Philipp Rost, Nürnberg (DE); Elmar Schäfers, Fürth (DE); Torsten Schür, Erlangen (DE); Björn Seelinger, Höchstadt (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 292 days.

(21) Appl. No.: 15/592,933

(22) Filed: May 11, 2017

(65) Prior Publication Data

US 2017/0329306 A1    Nov. 16, 2017

(30) Foreign Application Priority Data

May 12, 2016 (EP) ..................... 16169294

(51) Int. Cl.
*G05B 19/4063*    (2006.01)
*G05B 5/01*    (2006.01)
(Continued)

(52) U.S. Cl.
CPC .......... *G05B 19/4063* (2013.01); *G05B 5/01* (2013.01); *G05B 19/12* (2013.01);
(Continued)

(58) Field of Classification Search
CPC ................... G05B 5/01; G05B 15/02
See application file for complete search history.

(56) References Cited

U.S. PATENT DOCUMENTS 4,962,328 A    10/1990 Woss et al.
5,515,047 A *   5/1996 Yamakido ........... H03M 1/1019
                                                    341/153
(Continued)

FOREIGN PATENT DOCUMENTS

CN    1337045 A    2/2002
CN    1761920 A    4/2006
(Continued)

OTHER PUBLICATIONS

Frohnapfel et al., U.S. Pat. No. 8,917,002, Dec. 23, 2014, 2012-0293030, Nov. 22, 2012.
(Continued)

*Primary Examiner* — Crystal J Barnes-Bullock
(74) *Attorney, Agent, or Firm* — Henry M. Feiereisen LLC

(57) ABSTRACT

A closed-loop control device to control a system to be controlled includes a front node, back node, external tapping point, controller and compensating circuit. The compensating circuit has an inner node, frequency filter, front buffer and back buffer. The front node determines a difference; the back node supplies an external sum signal. A setting device automatically suppresses use of the output signal of the front buffer, supplies the back buffer and the back node with a first excitation signal as the compensation signal and detects a first result signal produced by the first excitation signal. The first result signal is one of the control difference, internal sum signal, output filtered signal of the frequency filter or output signal of the front buffer. The setting device evaluates the first excitation signal and the first result signal, sets a parameter of the frequency filter and the second propagation delay.

20 Claims, 7 Drawing Sheets

(51) Int. Cl.
  *G05B 19/12* (2006.01)
  *G05B 19/408* (2006.01)
  *G05B 19/4099* (2006.01)
  *H03L 7/02* (2006.01)

(52) U.S. Cl.
  CPC ..... *G05B 19/4083* (2013.01); *G05B 19/4099* (2013.01); *H03L 7/02* (2013.01); *G05B 2219/31228* (2013.01); *G05B 2219/37493* (2013.01); *G05B 2219/45187* (2013.01)

(56) References Cited

U.S. PATENT DOCUMENTS

| | | |
|---|---|---|
| 6,487,035 B1 | 11/2002 | Liu et al. |
| 6,597,528 B1 | 7/2003 | Pang et al. |
| 8,189,817 B2 * | 5/2012 | Risbo .................. H03F 1/32 330/10 |
| 9,859,870 B2 * | 1/2018 | Geissdorfer ........... G05B 15/02 |
| 2009/0243732 A1 | 10/2009 | Tarng et al. |
| 2010/0092262 A1 | 4/2010 | Hamann et al. |
| 2013/0085607 A1 | 4/2013 | Ladra et al. |
| 2015/0168940 A1 | 6/2015 | Geweth et al. |
| 2016/0056794 A1 | 2/2016 | Geissdörfer et al. |

FOREIGN PATENT DOCUMENTS

| | | |
|---|---|---|
| CN | 103151924 A | 6/2013 |
| CN | 103401515 A | 11/2013 |
| EP | 2988181 A1 | 2/2016 |
| JP | H01223808 A | 9/1989 |
| JP | H04186401 A | 7/1992 |

OTHER PUBLICATIONS

Ladra et al., U.S. Pat. No. 8,157,752, Apr. 17, 2012, 2010-0032879, Feb. 11, 2010.
Bitterolf et al., U.S. Pat. No. 8,955,789, Feb. 17, 2015, 2013-0026278, Jan. 31, 2013.
Ladra et al., U.S. Pat. No. 9,316,283, Apr. 19, 2016, 2013-0085617, Apr. 4, 2013.
Ladra et al., U.S. Pat. No. 8,763,771, filed Jul. 1, 2014, 2013-0081914, Apr. 4, 2013.

* cited by examiner

CLOSED-LOOP CONTROL DEVICE WITH ADAPTIVE FAULT COMPENSATION

CROSS-REFERENCES TO RELATED APPLICATIONS

This application claims the priority of European Patent Application, Serial No. 16169294.2, filed May 12, 2016, pursuant to 35 U.S.C. 119(a)-(d), the disclosure of which is incorporated herein by reference in its entirety as if fully set forth herein.

BACKGROUND OF THE INVENTION

The present invention relates to a closed-loop control device with adaptive fault compensation for controlling a system to be controlled.

The following discussion of related art is provided to assist the reader in understanding the advantages of the invention, and is not to be construed as an admission that this related art is prior art to this invention.

A closed-loop control device is frequently also called an adaptive control system. EP 2 988 181 A1 discloses a control facility with adaptive fault compensation. In this closed-loop control device, the compensating circuit is parameterized by a user.

With some controlled technical variables—in particular position values in the case of rotary axes—periodic disruptions occur. Disruptions of this kind can occur, for example, due to inertial or machining forces in machine tools or other production machines. Suppression of such disruptions by way of an adaptive control system with fault compensation significantly improves the quality of the control system, sometimes by more than one order of magnitude.

Parameterization of an adaptive control system is oftentimes difficult, in particular when a complex system to be controlled is involved. A practicable strategy for determining the parameters of the adaptive control system is not known, particularly if the transfer function of the closed control loop cannot be reliably measured.

It would be desirable and advantageous to address prior art shortcomings and to attain stable parameterization of an adaptive control system irrespective of whether the transfer function of the closed control loop can be measured or not.

SUMMARY OF THE INVENTION

According to one aspect of the present invention, a closed-loop control device for controlling a system to be controlled includes a front node receiving an actual value, detected at an output of the system to be controlled by a measuring device, and a corresponding desired value, and determining a control difference by determining a difference between the actual value and corresponding desired value, a controller, a back node receiving the control difference and a compensation signal and supplying the controller with an external sum signal formed by adding the control difference and the compensation signal, with the controller, using the external sum signal determining a control signal for the system to be controlled and outputting it to the system to be controlled, an external tapping point arranged between the front and the back node, a compensating circuit comprising an inner node which determines an internal sum signal by adding the control difference tapped at the external tapping point and weighted with a first weighting factor, and a feedback signal weighted with a second weighting factor, a frequency filter receiving the internal sum signal and carrying out a frequency filtering to output a filtered signal, a front buffer receiving the output filtered signal and configured to delay the output filtered signal by a first propagation delay and to output a correspondingly first delayed signal as an output signal, and a back buffer configured to delay the compensation signal by a second propagation delay and to output a correspondingly second delayed signal as a feedback signal, wherein, during normal operation of the closed-loop control device, the output signal of the front buffer is used as the compensation signal, a setting device which in a setting mode of the closed-loop control device automatically suppresses use of the output signal of the front buffer as the compensation signal, supplies the back buffer and the back node with a first excitation signal as the compensation signal instead, detects a first result signal produced by the first excitation signal, wherein the first result signal is selected from the group consisting of the control difference, the internal sum signal, the output filtered signal of the frequency filter and the output signal of the front buffer, and based on an evaluation of the first excitation signal and the first result signal, sets a parameter of the frequency filter and the second propagation delay.

The corresponding settings are used during subsequent normal operation of the closed-loop control device as the corresponding settings of the frequency filter and back buffer.

The limit frequency of the frequency filter in particular can be considered as a parameter thereof. Alternatively or additionally, the order of the frequency filter can also be parameterized in the individual case, however.

According to another advantageous feature of the present invention, during the course of evaluation of the first excitation signal and the first result signal, the setting device can determine a transfer function of a closed control loop and the setting device can set the parameter of the frequency filter and the second propagation delay on the basis of an evaluation of the transfer function of the closed control loop. This procedure is advantageous, in particular, if the transfer function of the closed-control loop can be determined with sufficient accuracy.

According to another advantageous feature of the present invention, the setting device can be configured to determine a plurality of vectors which include as a vector component at least the parameter of the frequency filter and the second propagation delay in each case, using the transfer function for the plurality of vectors, to determine a ratio of the output signal of the front buffer to the first excitation signal as a function of a frequency in each case, and to set the parameter of the frequency filter and the second propagation delay according to an optimal vector from the plurality of vectors, which is rated as being optimum according to a predetermined optimization criterion, wherein as a boundary condition to be observed, the predetermined optimization criterion can include that the ratio of the output signal of the front buffer to the first excitation signal as a function of the frequency remains below a predetermined threshold which, in turn, is less than 1, and wherein the optimal vector is rated the better the higher a limit frequency of the frequency filter is.

Optimum parameterization of the adaptive control system can be automatically achieved in this way.

It is possible that the setting device also determines other values. In particular, it is possible that the setting device also determines the first weighting factor and the second weighting factor. Alternatively, it is likewise possible, however, that the setting device sets the first weighting factor and the second weighting factor to predetermined values, i.e., to values that are not dependent on the determined transfer function.

However, the present invention demonstrates its full strength in the case where the transfer function cannot be determined or can only be determined with insufficient accuracy, because in this case also it is possible that the setting device determines a lowest absorber frequency of the closed-control loop on the basis of the evaluation of the excitation signal and the result signal. The setting device can in this case determine, in particular, the at least one parameter of the frequency filter in such a way that the limit frequency of the frequency filter matches a predetermined percentage of the lowest absorber frequency.

In addition, it is possible that in this case (if, in other words, the absorber frequency is used to determine the limit frequency of the frequency filter) with an auxiliary frequency, which is less than the limit frequency of the frequency filter determined using the lowest absorber frequency, the setting device determines a control loop propagation time for the auxiliary frequency, wherein the control loop propagation time is the time that elapses until a signal fed to the front node produces a change in the actual value, and sets the second propagation delay to the control loop propagation time.

When the absorber frequency is used to determine the limit frequency of the frequency filter, the setting device can also set the first weighting factor and the second weighting factor to predetermined values.

According to another advantageous feature of the present invention, before or after feeding the first excitation signal to the back buffer and the back node, the setting device can suppress use of the output signal of the front buffer as the compensation signal, supply the back buffer and the back node with a second excitation signal as the compensation signal, detect a second result signal produced thereby, wherein the second result signal now produced is selected from the group consisting of the control difference now produced, the internal sum signal now produced, the output filtered signal now produced of the frequency filter and the output signal now produced of the front buffer, and on the basis of an evaluation of the first excitation signal and the first result signal produced as a result on the one hand and the second excitation signal and the second result signal produced as a result on the other hand, the setting device decides whether it sets the parameter of the frequency filter and the second propagation delay.

The closed-loop control device is consequently capable of automatically optimally parameterizing itself in the case that it can reliably determine the transfer function, and nevertheless parameterizing itself, in the case that it cannot determine the transfer function or can only determine it unreliably, such that the adaptive control system is not optimum but remains stable.

The compensating circuit acts within the closed-control loop. It can therefore become unstable in the individual case. The initial parameterization of the compensating circuit is chosen in such a way that the adaptive control system (including compensating circuit) is stable. With complex machines, a situation can occur, however, where the transfer function of the closed-control loop changes over the course of time. It is precisely in this case that instability can occur. Thus, according to another advantageous feature of the present invention and to avoid damage to the controlled device in the event of this kind of instability, provision can be made for a monitoring system which can be configured to automatically monitor during normal operation of the closed-loop control device, a time characteristic of the compensation signal, and to suppress a feeding of the output signal of the front buffer to the back node and/or to set the parameter of the frequency filter and the second propagation delay to different values as soon as the monitoring of the time characteristic of the compensation signal demonstrates an instability of the compensating circuit.

According to another advantageous feature of the present invention, the closed-loop control device can be constructed as a software-programmable closed-loop control device and programmed with a software module, which when loaded into the control device, causes the control device to be configured as set forth above.

According to another advantageous feature of the present invention, the closed-loop control device can be constructed for use in the control of an axle of a printing machine.

According to another aspect of the present invention, a closed-loop control method for a system to be controlled, wherein the system to be controlled comprises a front node, a back node, an external tapping point arranged between the front and the back node, a controller, a compensating circuit, a measuring device and a setting device, and the compensating circuit comprises an inner node, a frequency filter, a front buffer and a back buffer, includes the front node receiving an actual value detected at an output of the system to be controlled by means of the measuring device, and a corresponding desired value, the front node determining a control difference from the difference between the actual value and the corresponding desired value, the back node receiving the control difference and a compensation signal, the back node supplying the controller with an external sum signal formed by adding the control difference and the compensation signal, using the external sum signal, the controller determining a control signal for the system to be controlled, the controller outputting the control signal to the system to be controlled, the inner node determining an internal sum signal by adding the control difference tapped at the external tapping point and weighted with a first weighting factor, and a feedback signal weighted with a second weighting factor, the inner node supplying the internal sum signal to the frequency filter, the frequency filter carrying out a frequency filtering, the frequency filter supplying an output filtered signal to the front buffer, the front buffer delaying the output filtered signal by a first propagation delay, the front buffer outputting a correspondingly first delayed signal as an output signal, the back buffer delaying the compensation signal by a second propagation delay, the back buffer outputting a correspondingly second delayed signal as a feedback signal, during normal operation of the closed-loop control method, using the output signal of the front buffer as the compensation signal, while in a setting mode of the closed-loop control method, the setting device automatically suppressing use of the output signal of the front buffer as the compensation signal, supplying the back buffer and the back node with a first excitation signal as the compensation signal instead, detecting a first result signal produced by the first excitation signal, selecting the first result signal from the group consisting of the control difference, the internal sum signal, the output filtered signal of the frequency filter and the output signal of the front buffer, and based on an evaluation of the first excitation signal and the first result signal, setting a parameter of the frequency filter and the second propagation delay.

According to still another aspect of the present invention, a software module, includes machine code adapted to be processed by a closed-loop control device to cause a configuration of the closed-loop control device as set forth above.

According to another advantageous feature of the present invention, the software module can be stored on a data carrier in machine-readable form.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
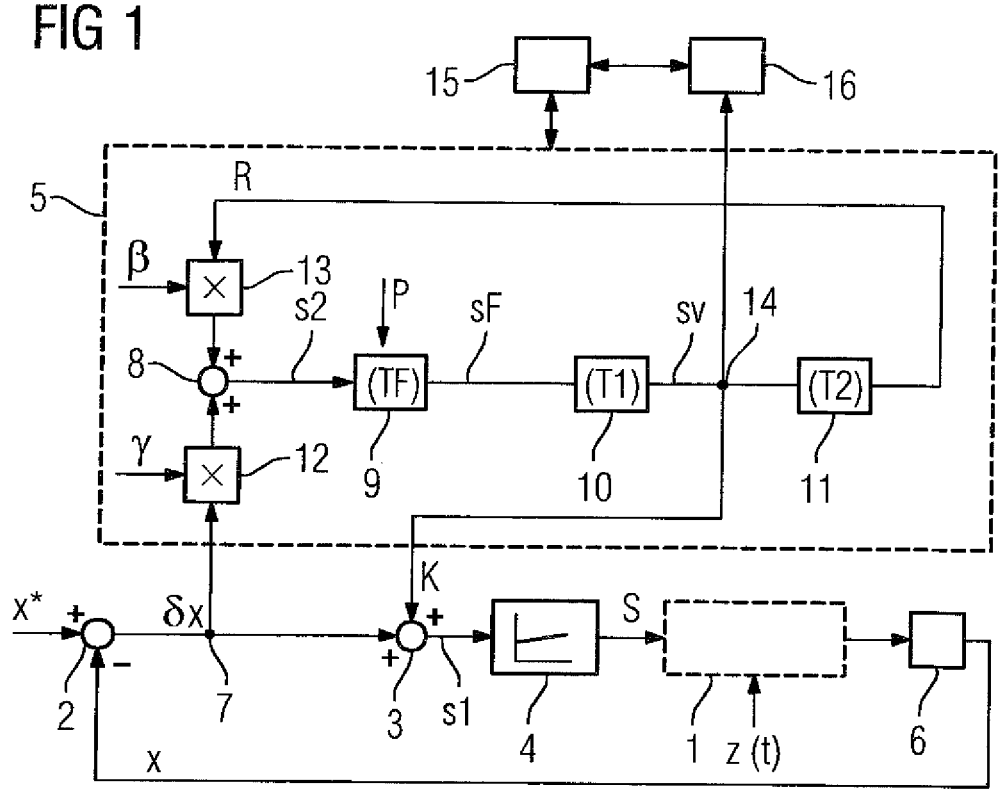
FIG. 1 shows a closed-loop control device for controlling a system to be controlled.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments may be illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a closed-loop control device for controlling a controlled system 1. The closed-loop control device has a front node 2, a back node 3, a controller 4 and a compensating circuit 5. The closed-loop control device can be used, in particular, to control an axle of a printing machine—in particular what is known as a rotary axle. However, it can also be used in other ways, be that for controlling a rotary axle, for controlling a linear axle, or be that in some other way.

During normal operation of the closed-loop control device, the front node 2 receives an actual value x and a corresponding desired value x*. The actual value x is detected metrologically at the output of the system to be controlled 1 by means of a measuring device 6. The front node 2 determines a control difference δx by forming the difference between desired value x* and actual value x. The back node 3 receives the control difference δx and a compensation signal K. The back node 3 adds the control difference δx and the compensation signal K and thereby forms a sum signal s1, hereinafter called an external sum signal s1. The back node 3 feeds the external sum signal s1 to the controller 4. Using the external sum signal s1 with which it has been fed, the controller 4 determines a control signal S for the system to be controlled 1. The controller 4 outputs the control signal S to the system to be controlled 1.

The controller 4 can be designed, for example, as a PI controller. It can also have a different control characteristic, however.

Figure 2:
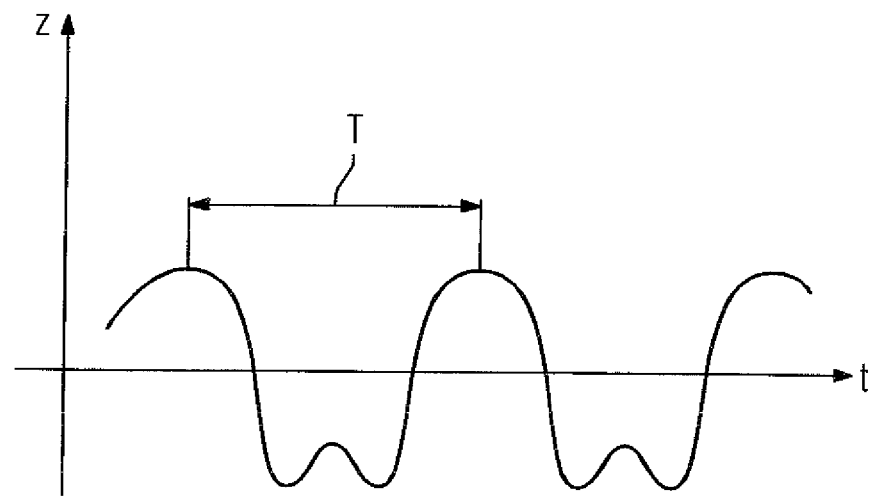
FIG. 2 shows a time graph of a disruption.

The detected actual value x is stressed by a disruption z. The disruption z is a periodic function of time t according to the graph in FIG. 2. It therefore has a periodic duration T. The compensating circuit 5 and the compensation signal K determined by the compensating circuit 5 are used for compensation of the disruption z.

To be able to determine the compensation signal K, the closed-loop control device has an external tapping point 7 which is arranged between the front and back nodes 2, 3. The control difference δx is tapped at the external tapping point 7 and fed to the compensating circuit 5. The compensating circuit 5 determines the compensation signal K and feeds it to the back node 3.

The compensating circuit 5 has an inner node 8, a frequency filter 9, a front buffer 10 and a back buffer 11. Two multipliers 12, 13 are connected upstream of the inner node 8. The control difference δx is fed to the multiplier 12, a feedback signal R is fed to the multiplier 13. The multipliers 12, 13 multiply the signals δx, R with which they have been fed by a respective weighting factor γ, β and feed the products to the inner node 8. The inner node 8 receives the products. The inner node 8 adds the control difference δx weighted with the weighting factor γ and the feedback signal R weighted with the weighting factor β and thereby forms a further sum signal s2, hereinafter called an internal sum signal s2. The internal sum signal s2 feeds the inner node 8 to the frequency filter 9.

The frequency filter 9 carries out frequency filtering. For this purpose, the frequency filter 9 can be designed, for example, as a non-recursive digital filter, in particular as a low-pass filter. A filter order of the frequency filter 9 can be set by setting corresponding parameters P. The same applies to a limit frequency fG of the frequency filter 9. The frequency filter 9 feeds the correspondingly output filtered signal sF—hereinafter also called the output filtered signal sF—to the front buffer 10.

The front buffer 10 delays the output filtered signal sF of the frequency filter 9 by a first propagation delay T1 and then outputs it as an output signal sv. During normal operation, the front buffer 10 feeds the output signal sv to the back buffer 11. The back buffer 11 delays the output signal sv by a second propagation delay T2 in a similar manner. The back buffer 11 outputs the correspondingly delayed signal as a feedback signal R.

An internal tapping point 14 is arranged between the front buffer 10 and the back buffer 11. The compensation signal K is tapped at the internal tapping point 14 and fed to the back node 3. During normal operation, it is identical to the output signal sv. The output signal sv of the front buffer 10 is therefore used as compensation signal K during normal operation of the closed-loop control device.

As already mentioned, the frequency filter 9 has a filter order. The filter order corresponds to a delay time TF. As a rule, the frequency filter 9 and the two buffers 10, 11 are designed in such a way that the relationship $$TF+T1+T2=n \cdot T \qquad (1)$$

applies. n is an integer. As a rule the number n is as small as possible. The number n often has the value 1 or the value 2.

In conjunction with the normal control system (i.e. without compensating circuit 5), the system to be controlled 1 has a control loop propagation time TL. The control loop propagation time TL is the time that elapses until a signal fed to the front node 2 causes a change in the actual value x. The back buffer 11 should be designed in such a way that the relationship $$T2 = TL \quad (2)$$

applies. The sum of the delay times TF, T1 of frequency filter 9 and front buffer 10 is therefore an integral multiple of the periodic duration T of the disruption z minus the control loop propagation time TL.

The closed-loop control device also has a setting device 15. The setting device 15 is effective in a setting mode of the closed-loop control device. The function of the setting device 15 is automatic here.

Figure 3:
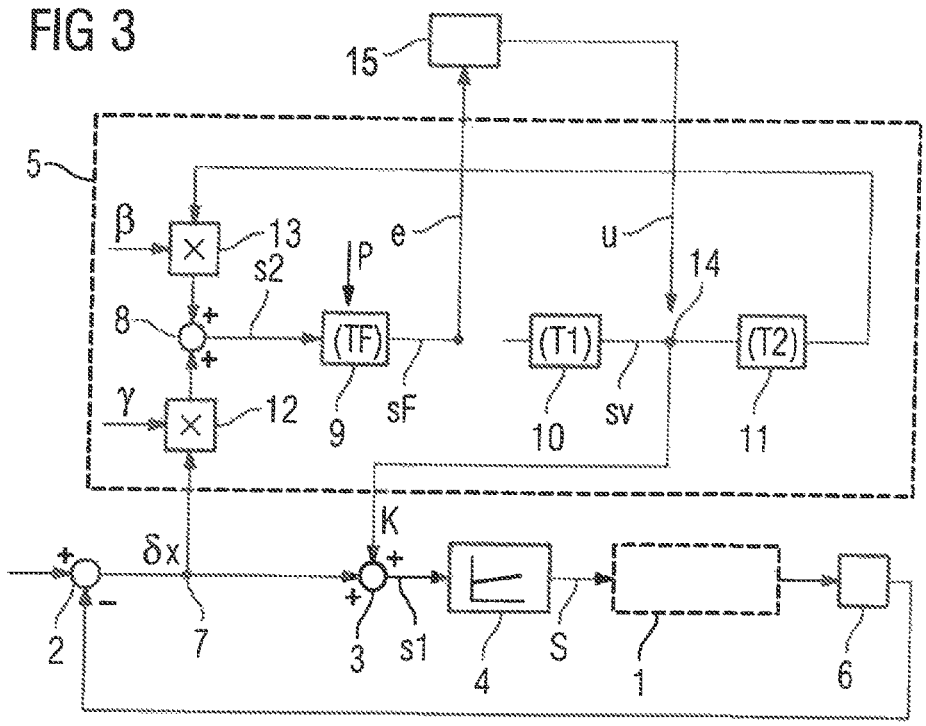
FIG. 3 shows the closed-loop control device in FIG. 1 with an open compensating circuit.
Figure 4:
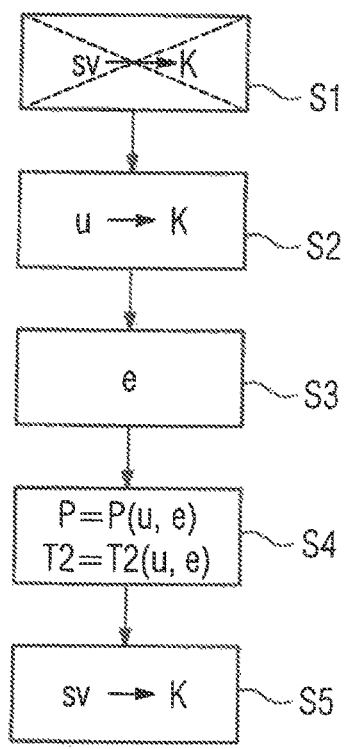
FIGS. 4 and 5 show flowcharts.

In setting mode, the setting device 15 in a step S1—see FIGS. 3 and 4—opens the connection of the frequency filter 9 with the back buffer 11. Opening can alternatively occur upstream of the front buffer 10, in the front buffer 10 or downstream of the front buffer 10. In particular, the use of the output signal sv of the front buffer 10 as compensation signal K is suppressed by opening the connection. Instead, in a step S2 the setting device 15 feeds a first excitation signal u as compensation signal K to the back buffer 11 and the back node 3. In a step S3, the setting device 15 also detects a first result signal e, which is produced by the first excitation signal u. According to the diagram in FIG. 3 the first result signal e can be the output filtered signal sF, i.e., the output signal of the frequency filter 9. Alternatively, the first result signal e can be the control difference δx, the internal sum signal s2 or the output signal sv of the front buffer 10. The last embodiment is only possible if the connection of the frequency filter 9 with the back buffer 11 is opened downstream of the front buffer 10.

In a step S4, the setting device 15 then sets a parameter P of the frequency filter 9 and the second propagation delay T2. The setting of the parameter P and the second propagation delay T2 is based on an evaluation of the first excitation signal u and the first result signal e. In a step, S5 the setting device 15 then restores the connection of the frequency filter 9 with the back buffer 11. The output signal sv of the front buffer 10 is therefore used as compensation signal K again. The determination mode ends with the reconnection of compensation signal K.

With the exception of opening the connection of the frequency filter 9 with the back buffer 11 and the associated differences during normal operation, described above, operation of the closed-loop control device in setting mode is unchanged.

The procedure of the present invention is based on the fact that in setting mode, the following relationships apply for the control difference δx, the internal sum signal s1, the output filtered signal sF and the output signal sv of the front buffer 10:

$$\delta x(s) = G(s) \cdot u(s) \quad (3)$$

$$s2(s) = (\gamma G(s) + \beta e^{-sT2}) \cdot u(s) \quad (4)$$

$$sF(s) = H(s) \cdot (\gamma G(s) + \beta e^{-sT2}) \cdot u(s) \quad (5)$$

$$sv(s) = e^{-sT1} \cdot H(s) \cdot (\gamma G(s) + \beta e^{-sT2}) \cdot u(s) \quad (6).$$

In equations (3) to (6), s is the Laplace operator, G is the transfer function of the closed-control loop and H is the filter function of the frequency filter 9. In equations (3) to (6), essentially only the transfer function G is unknown. The transfer function G can therefore be determined using one of the equations (3) to (6).

Figure 5:
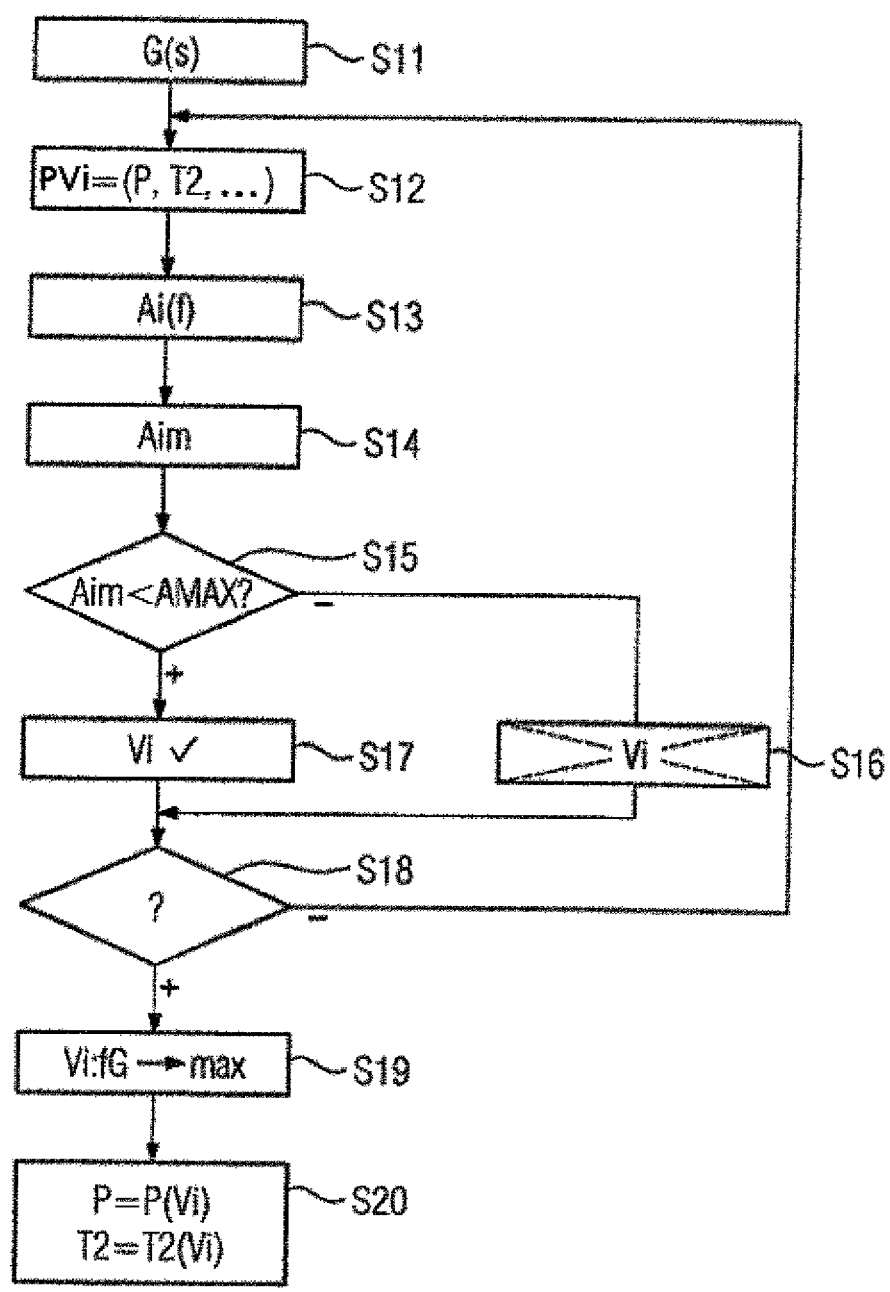

In one possible implementation of step S4 in FIG. 4, it is therefore possible according to FIG. 5—see FIG. 5 for the case where equation (3) is used—that the setting device 15 determines the transfer function G(s) of the closed-control loop during the course of evaluation of the first excitation signal u and the first result signal e in a step S11. In this case the setting device 15 sets the parameter P of the frequency filter 9 and the second propagation delay T2 on the basis of an evaluation of the transfer function G. In particular the setting device 15 can in this case determine one or more vectors Vi forming a plurality of vector PVi (i=1, 2, 3, . . . ) in a step S12. Each vector Vi of the plurality of vectors PVi contains as vector component a set of variables to be set, i.e., at least the parameter P of the frequency filter 9 and the second propagation delay T2 and optionally also further variables, such as, for example, the first weighting factor γ and/or the second weighting factor β. Alternatively, it is possible that the weighting factors γ, β are strictly predefined. In particular, they can be set to the value 1.

Figure 6:
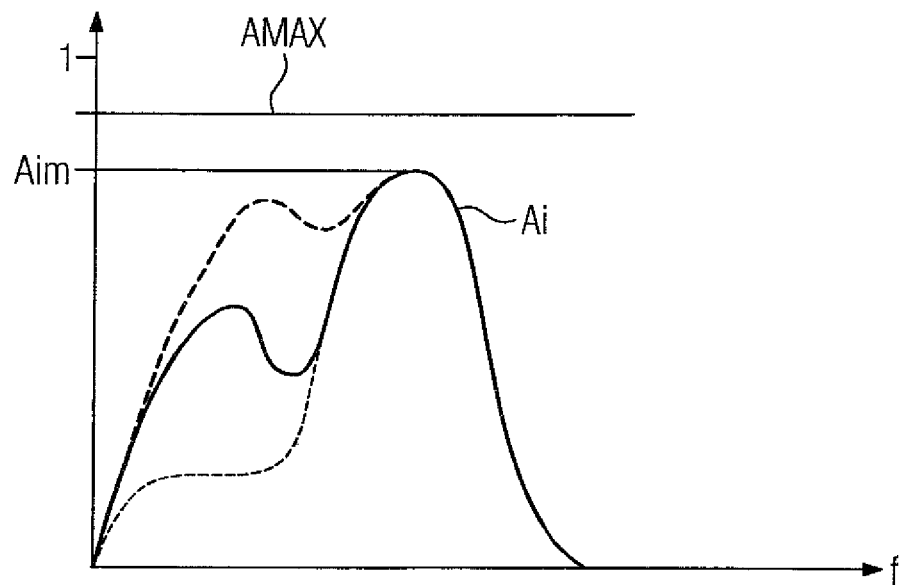
FIG. 6 shows frequency responses.

In a step S13, the determining device 15 in this case determines for the vector Vi the associated amplification Ai as a function of the frequency f. The determining device 15 therefore forms—as a function of the frequency f—the ratio of signal sv at the output of the front buffer 10 and first excitation signal u. FIG. 6 shows purely by way of example in solid lines the resulting amplification Ai. The determining device 15 uses the transfer function G when determining the signal sv.

In a step S14, the determining device 15 determines the maximum value Aim of the amplification Ai. In a step S15, the determining device 15 checks whether the maximum value Aim lies below a predetermined threshold AMAX. According to the graph in FIG. 6, the threshold AMAX is in turn less than 1. If this is not the case, the vector Vi is rejected in a step S16. Otherwise, the vector Vi is preselected in a step S17 as a "candidate" for the subsequently valid vector Vi. In a step S18, the determining device 15 checks whether it has already performed steps S12 to S17 for all required vectors Vi, in other words, whether the index i has attained its end value. If this is not the case, the determining device 15 returns to step S12 in which it determines a new vector Vi. Otherwise the determining device 15 skips to a step S19.

Using the vectors Vi preselected in step S17, in step S19 the setting device 15 determines the optimal vector Vi with which the limit frequency fG of the frequency filter 9 is maximal. According to this optimal vector Vi, the parameter P of the frequency filter 9 and second propagation delay T2 are then set in a step S20.

As a result the setting device therefore rates the plurality of vectors PVi according to a predetermined optimization criterion, wherein the predetermined optimization criterion contains as a boundary condition, which is to be (compulsorily) observed, that the amplification Ai remains below the predetermined threshold AMAX as a function of the frequency f, and, furthermore, the vector Vi is rated all the better the higher the limit frequency fG of the frequency filter 9 is.

In tests, it has been found that the second propagation delay T2 can be critical, i.e., that a significant change in the resulting amplification Ai can occur as a function of the frequency f even with a slightly different second propagation delay T2. The procedure of FIG. 5 is therefore modified such that for the respective vector Vi, a particular (supplement: unique, fixed) second propagation delay T2 is determined during the course of step S12, but during the course of step S13 the respectively associated amplification Ai is determined, as a function of the frequency f, multiple times in each case for a plurality of values of the second propagation delay T2. These values define an interval around the second propagation delay T2 defined by the vector Vi. For the limits T2u, T2o of this interval either the relationships $$\frac{T2 - T2u}{T2} = k1 \quad (7)$$

$$\frac{T2o - T2}{T2} = k2 \quad (8)$$

or the relationships $$T2-T2u=k3 \quad (9)$$

$$T2o-T2=k4 \quad (10)$$

apply, where k1 to k4 are constants greater than 0. The constants k1 and k2 can, but do not have to, have the same value. Similarly, the constants k3 and k4 can, but do not have to, have the same value. For example, in the case of application of equations (7) and (8), the constants k1 and k2 can, in particular, have values between 0.15 and 0.25.

If determination in step S13 occurs for a plurality of values of the second propagation delay T2, the determining device 15 determines the maximum value Aim of the amplification Ai in step S14 in a propagation-time-overarching manner for all amplifications Ai determined during performance of respective step S13.

By means of the procedure described above in conjunction with FIGS. 4 to 6, a stable, robust and optimum or virtually optimum parameterization of the compensating circuit 5 is automatically possible. This procedure assumes, however, that the transfer function G can be reliably determined. This is not always the case, however. For example, with printing machines—but also with some other production machines and sometimes also with machine tools—the transfer function G is time variable and/or non-linear, i.e. dependent on the amplitude of the first excitation signal u. In such, cases, the previously described procedure frequently leads only to unsatisfactory results. In such cases an alternative procedure is recommended, and this will be described in more detail below in conjunction with FIG. 7.

Figure 7:
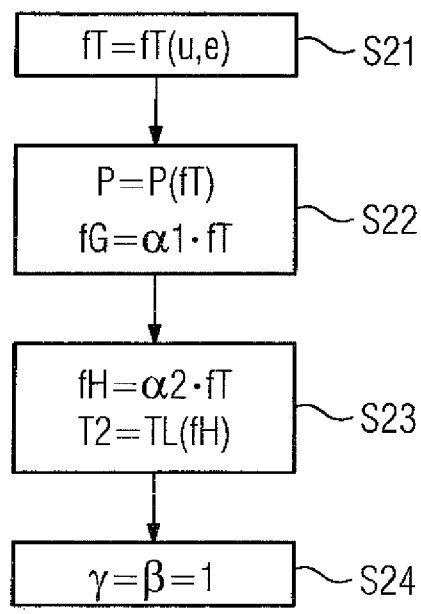
FIGS. 7 and 8 show flowcharts.

FIG. 7 shows—like FIG. 5—one possible implementation of step S4 in FIG. 4. According to FIG. 7, the setting device 15 determines in a step S21 a lowest absorber frequency fT of the closed-control loop. Determination in step S21 is based on the evaluation of the first excitation signal u and the first result signal e. In this case, the setting device 15 determines in a step S22 the at least one parameter P of the frequency filter 9 in such a way that the limit frequency fG of the frequency filter 9 matches a predetermined first percentage α1 of the lowest absorber frequency fT. The first percentage α1 can lie, for example, between 30% and 70%, in particular between 40% and 60%. In particular, a value of about 50% has proven to be advantageous in practice. Furthermore, the setting device 15 determines in a step S22 an auxiliary frequency fH. The auxiliary frequency fH lies below the limit frequency fG. For example, the auxiliary frequency fH can be equal to a second percentage α2 of the limit frequency fG. The second percentage α2 can lie, for example, between 30% and 70%, in particular between 40% and 60%. In particular, a value of about 50% has proven to be advantageous in practice. The setting device 15 then determines in a step S23 the associated control loop propagation time TL for the auxiliary frequency fH and sets the second propagation delay T2 to the control loop propagation time TL. Finally, in a step S24, the setting device 15 sets the first weighting factor γ and the second weighting factor β to predetermined values. The two weighting factors β, γ can, for example, both be set to the value 1.

It is even possible to combine the two principle procedures—i.e. the procedure in FIGS. 4 and 5 on the one hand and the procedure in FIG. 7 on the other hand. In this case, it is first of all discovered whether expedient and reliable setting of the at least one parameter P of the frequency filter 9 and the second propagation delay T2 is possible by means of the procedure in FIGS. 4 and 5. If this is not possible, however, the at least one parameter P of the frequency filter 9 and the second propagation delay 12 are set according to the procedure in FIG. 7. This will be described in more detail below in connection with FIG. 8.

Figure 8:
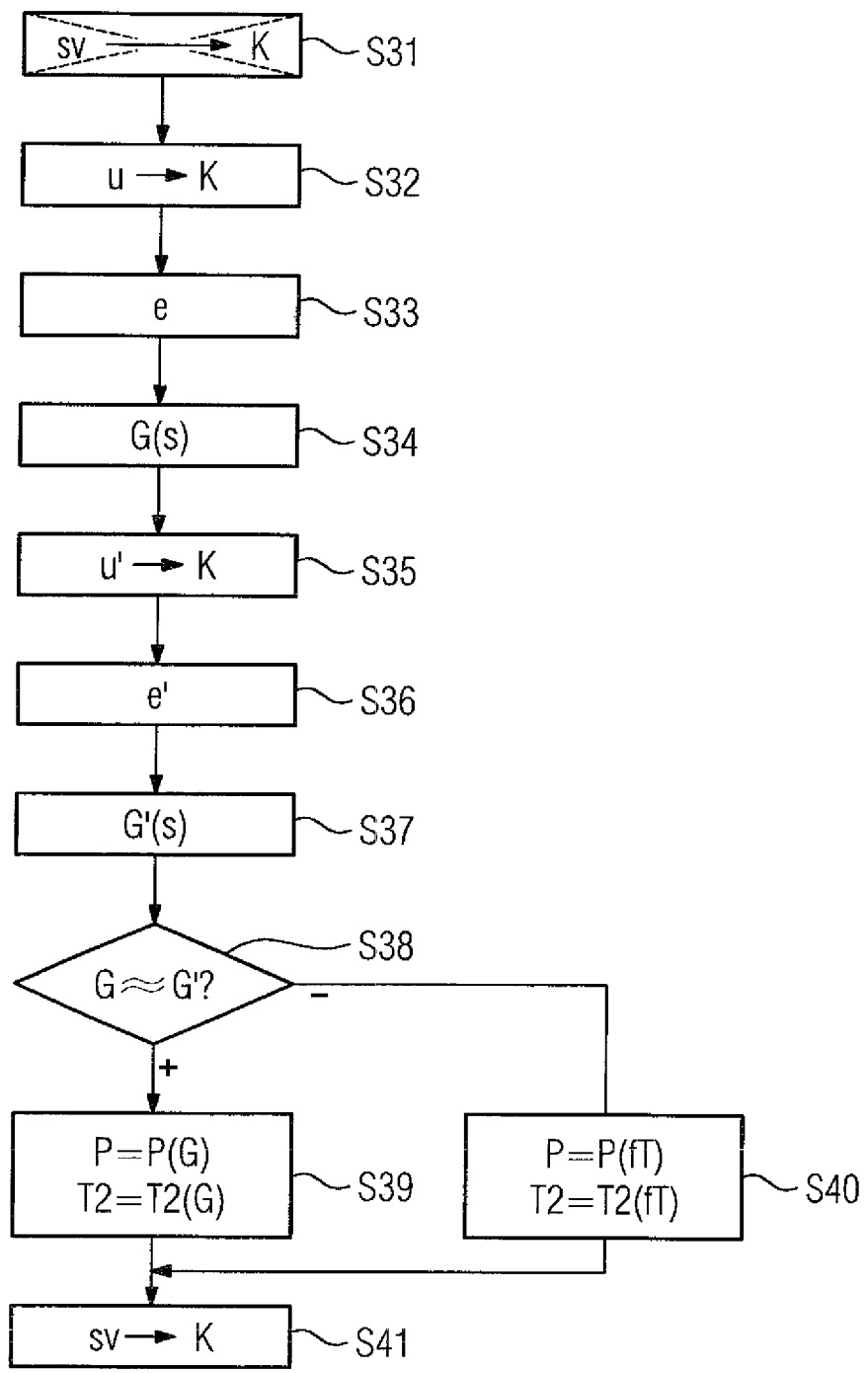

According to FIG. 8, in a step S31, the setting device 15 firstly opens the connection of the frequency filter 9 with the back buffer 11. Furthermore, in a step S32, the setting device 15 instead feeds a first excitation signal u as compensation signal K to the back buffer 11 and the back node 3. In a step S33, the setting device 15 also detects a first result signal e which is produced by the first excitation signal u. In a step S34, the setting device 15 determines the transfer function G(s) of the closed-control loop by evaluation of the first excitation signal u and the first result signal e. The steps S31 to S33 and S34 correspond to steps S1 to S3 in FIG. 4 and the step S11 in FIG. 5.

The setting device 15 then carries out steps S35 and S36. The steps S35 and S36 correspond in terms of content to steps S32 and S33. Instead of the first excitation signal u in step S32, a second excitation signal u' is used, however, hereinafter called the second excitation signal u'. A different second result signal e' is also produced therefore, hereinafter called the second result signal e'. In a step S37, the setting device 15 determines a second transfer function G'(s) of the closed-control loop, hereinafter called the second transfer function G'(s), by evaluation of the second excitation signal u' and the second result signal e'. Step S37 corresponds to step S34, albeit based on the second excitation signal u' and the second result signal e'.

Ideally, the two transfer functions G, G' are identical. In reality, they can differ from each other. The determining device 15 therefore checks in a step S38 whether the transfer functions G, G' match or at least match to an adequate extent. If this is the case, the parameter P of the frequency filter 9 and the second propagation delay T2 as well as optionally further variables are set in a step S39 on the basis of the first transfer function G or the second transfer function G'. The step S39 corresponds in terms of content with steps S12 to S20 in FIG. 5. Otherwise the parameters P of the frequency filter 9 and the second propagation delay T2 as well as optionally the further variables are set in a step S40 on the basis of the lowest absorber frequency Step S40 corresponds in terms of content with steps S21 to S24 in FIG. 7. In a step S41—analogously to step S5 in FIG. 4—the setting device 15 accordingly restores the connection of the frequency filter 9 with the back buffer 11.

Figure 9:
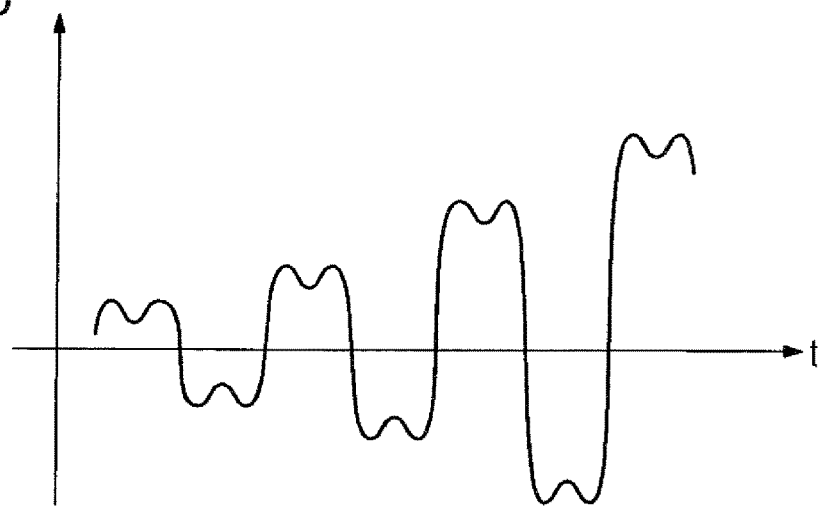
FIG. 9 shows a time graph of a compensation signal.

Irrespective of the manner in which the setting of the parameter P of the frequency filter 9 and the second propagation delay T2 is made, the setting is made in such a way that the closed-loop control device works stably. If, however, during the course of operation of the system to be controlled 1 the transfer function G(s) of the closed-control loop changes, then according to the graph in FIG. 9, the compensating circuit 5 can become unstable. In this case, the compensation signal K gradually builds up more and more. This can cause damage to the system to be controlled or machine (which contains the system to be controlled 1). To prevent damage, the closed-loop control device—see FIG. 1—advantageously has a monitoring system 16. During normal operation of the closed-loop control device, the monitoring system 16 automatically monitors the time characteristic of the compensation signal K. In particular, in a step S51, the monitoring system 16 taps the compensation signal during normal operation according to FIG. 10 and evaluates it in a step S52. For example, the monitoring system 16 can determine whether the value of the compensation signal K exceeds a predetermined threshold value or whether the compensation signal K always became greater over a plurality of periods of disruption z than in the preceding periods respectively. A suitable number of periods can be, for example, between 4 and 10. It is also possible to determine a control difference δx that occurs as a maximum if the compensating circuit 5 is switched to inactive. In this case, the predetermined threshold value can, for example, be determined by multiplication of this maximal value by a factor.

In a step S53, the monitoring system 16 checks whether such a case of instability of the compensation signal K exists. If this is the case, the monitoring system 16 skips to step S54. In step S54, the setting device 15 opens the connection of the frequency filter 9 with the back buffer 11 analogously to step S1 in FIG. 4. Control of the system to be controlled 1 continues therefore by way of the controller 4, but application of the compensation signal K to the control difference δx is suppressed as a result.

Figure 10:
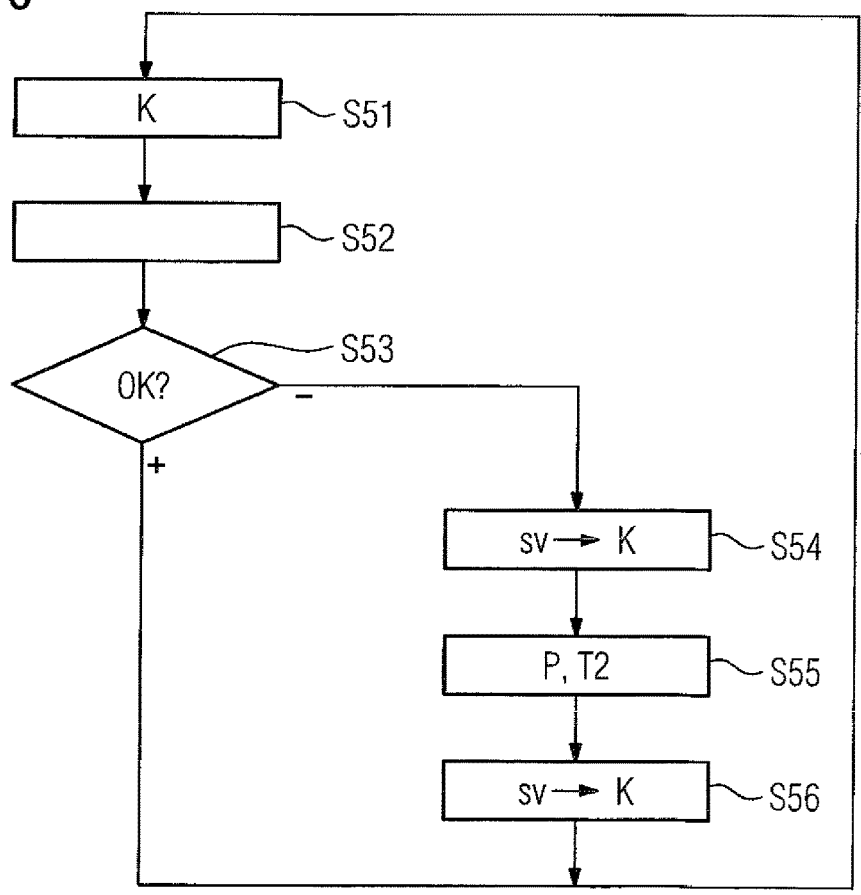
FIG. 10 shows a flowchart and FIG. 11 shows a closed-loop control device for controlling a system to be controlled.

It is possible that the procedure in FIG. 10 is ended thereby. In this case, the monitoring system 16 only suppresses the output signal sv of the front buffer 10 being fed to the back buffer 11 and the back node 3 in the course of step S54 and thereby being used as compensation signal K. Alternatively, it is possible that steps S55 and S56 are also present. In step S55, the monitoring system 16 sets the at least one parameter P of the frequency filter 9 and/or the second propagation delay T2 to a different value. In particular, the monitoring system 16 can effect corresponding control of the setting device 15 or form a shared device with the setting device 15. In step S56, the setting device 15—analogously to step S5 in FIG. 4—restores the connection of the frequency filter 9 with the back buffer 11. The compensation signal K is therefore applied to the control difference Ox again.

During the course of implementation of steps S55 and S56, it is, for example, possible that the monitoring system 16 checks whether the at least one parameter P of the frequency filter 9 and/or the second propagation delay T2 were determined on the basis of the transfer function G(s) or on the basis of the lowest absorber frequency fT. in the former case, in step S55, the monitoring system 16 can carry out or trigger—as a retreat line as it were—determination on the basis of the lowest absorber frequency fT; in the latter case it cannot perform steps S55 and S56. It is also possible, —so to say, as a retreat line—for the at least one parameter P of the frequency filter 9 and the second propagation delay T2 to use previously determined values instead of the inventively determined values. In this case, a fault compensation can sometimes still occur which works suboptimally but still remains reliably stable.

Figure 11:
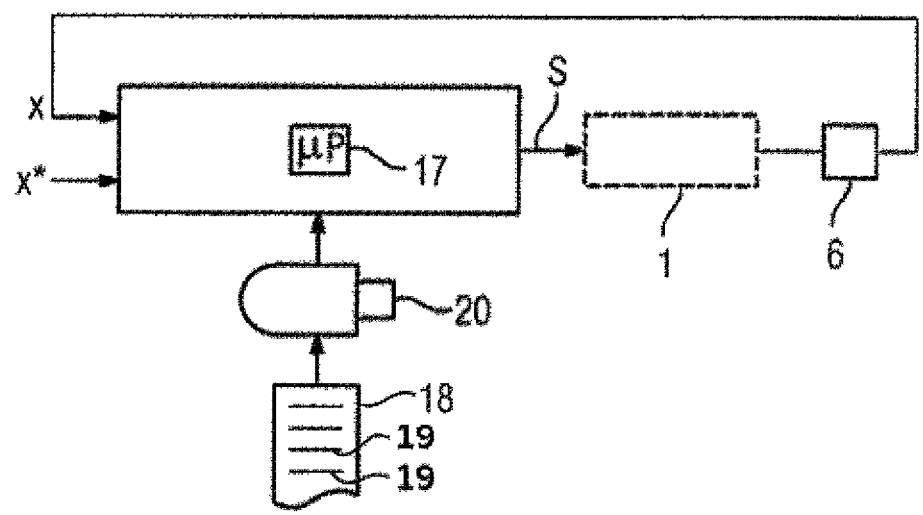

The closed-loop control device is advantageously designed according to the diagram in FIG. 11 as a software-programmable closed-loop control device. It therefore comprises a microprocessor 17. The closed-loop control device is in this case programmed with a software module 18. As a result of programming with the software module 18, the closed-loop control device is inventively designed. The software module 18 comprises machine code 19. Processing of the machine code 19 by the closed-loop control device therefore means that the closed-loop control device is inventively designed, i.e. the front and the back nodes 2, 3, the controller 4, the compensating circuit 5 (including its components 8 to 14), the tapping point 7 and at least the setting device 15, optionally also the monitoring system 16 and its modes of operation described above, are implemented.

In principle, the software module 18 can be fed to the closed-loop control device in any manner. In particular, the software module 18 can be stored on a data carrier 20 in machine-readable form. The diagram in FIG. 11, in which the data carrier 20 is shown as a USB memory stick, should be understood to be purely exemplary, however, and not limiting.

To summarize, the present invention therefore relates to the following facts:

For automatic parameterization of a compensating circuit 5 of an adaptive control system, a closed-loop control device has a setting device 15, which in setting mode of the closed-loop control device automatically feeds a first excitation signal u as a compensation signal K to an application point of the control loop and detects a first result signal e produced by the first excitation signal u. Based on an evaluation of the first excitation signal u and the first result signal e, the setting device 15 sets at least one parameter P of a frequency filter 9 of the compensating circuit 5 and the propagation delay T2 of a buffer 11, with the buffer 11 being the buffer whose output signal R is fed back weighted with a marker factor within the compensating circuit 5.

The present invention has many advantages. It is not just that the parameterization can be automated therefore. Instead in many cases, parameterization of the compensating circuit 5 can even be achieved in which the limit frequency fG of the frequency filter 9 lies in the high 2-digit Hertz range, for example above 70 Hz. With a varying transfer function G, damage to the system to be controlled 1 can also be reliably ruled out by way of the monitoring system 16.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

What is claimed as new and desired to be protected by Letters Patent is set forth in the appended claims and includes equivalents of the elements recited therein:

1. A closed-loop control device for controlling a system to be controlled, comprising:
    a front node receiving an actual value, detected at an output of the control process by a measuring device, and a corresponding desired value, and determining a control difference by determining a difference between the actual value and corresponding desired value;
    a controller;
    a back node receiving the control difference and a compensation signal and supplying the controller with an external sum signal formed by adding the control difference and the compensation signal, with the controller, using the external sum signal determining a control signal for the system to be controlled and outputting the external sum signal to the system to be controlled;

an external tapping point arranged between the front and the back node;

a compensating circuit comprising an inner node which determines an internal sum signal by adding the control difference tapped at the external tapping point and weighted with a first weighting factor, and a feedback signal weighted with a second weighting factor, a frequency filter receiving the internal sum signal and carrying out a frequency filtering to output a filtered signal, a front buffer receiving the output filtered signal and configured to delay the output filtered signal by a first propagation delay and to output a correspondingly first delayed signal as an output signal, and a back buffer configured to delay the compensation signal by a second propagation delay and to output a correspondingly second delayed signal as a feedback signal, wherein, during normal operation of the closed-loop control device, the output signal of the front buffer is used as the compensation signal;

a setting device which in a setting mode of the closed-loop control device automatically suppresses use of the output signal of the front buffer as the compensation signal, supplies the back buffer and the back node with a first excitation signal as the compensation signal instead, detects a first result signal produced by the first excitation signal, wherein the first result signal is selected from the group consisting of the control difference, the internal sum signal, the output filtered signal of the frequency filter and the output signal of the front buffer, and based on an evaluation of the first excitation signal and the first result signal, sets a parameter of the frequency filter and the second propagation delay.

2. The closed-loop control device of claim 1, wherein during the course of evaluation of the first excitation signal and the first result signal, the setting device determines a transfer function of a closed control loop and that the setting device sets the parameter of the frequency filter and the second propagation delay on the basis of an evaluation of the transfer function of the dosed control loop.

3. The closed-loop control device of claim 2, wherein the setting device is configured to determine a plurality of vectors which include as a vector component the parameter of the frequency filter and the second propagation delay in each case, using the transfer function for the plurality of vectors, to determine a ratio of the output signal of the front buffer to the first excitation signal as a function of a frequency in each case, and to set the parameter of the frequency filter and the second propagation delay according to an optimal vector from the plurality of vectors, which is rated as being optimum according to a predetermined optimization criterion, wherein as a boundary condition to be observed, the predetermined optimization criterion includes that the ratio of the output signal of the front buffer to the first excitation signal as a function of the frequency remains below a predetermined threshold which, in turn, is less than 1, and wherein the optimal vector is rated the better the higher a limit frequency of the frequency filter is.

4. The closed-loop control device of claim 1, wherein the setting device determines a lowest absorber frequency of the closed control loop on the basis of the evaluation of the first excitation signal and the first result signal and that the setting device determines the parameter of the frequency filter in such a way that the limit frequency of the frequency filter matches a predetermined percentage of the lowest absorber frequency.

5. The closed-loop control device of claim 4, wherein at an auxiliary frequency, which is less than the limit frequency of the frequency filter determined using the lowest absorber frequency, the setting device determines a control loop propagation time for the auxiliary frequency, wherein the control loop propagation time is the time that elapses until a signal fed to the front node produces a change in the actual value, and sets the second propagation delay to the control loop propagation time.

6. The closed-loop control device of claim 1, wherein the setting device fixes the first weighting factor and the second weighting factor at predetermined values.

7. The closed-loop control device of claim 1, wherein before or after feeding the first excitation signal to the back buffer and the back node, the setting device suppresses use of the output signal of the front buffer as the compensation signal, supplies the back buffer and the back node with a second excitation signal as the compensation signal, detects a second result signal produced thereby, wherein the second result signal now produced is selected from the group consisting of the control difference now produced, the internal sum signal now produced, the output filtered signal now produced of the frequency filter and the output signal now produced of the front buffer, and on the basis of an evaluation of the first excitation signal and the first result signal produced as a result on the one hand and the second excitation signal and the second result signal produced as a result on the other hand, the setting device decides whether the setting device sets the parameter of the frequency filter and the second propagation delay.

8. The closed-loop control device of claim 1, further comprising a monitoring system configured to automatically monitor during normal operation of the closed-loop control device, a time characteristic of the compensation signal, and to suppress a feeding of the output signal of the front buffer to the back node and/or to set the parameter of the frequency filter and/or the second propagation delay to different values as soon as the monitoring of the time characteristic of the compensation signal demonstrates an instability of the compensating circuit.

9. The closed-loop control device of claim 1, constructed in the form of a software-programmable closed-loop control device that is programmed with a software module which when loaded into the control device, causes the control device to be configured as set forth in claim 1.

10. The closed-loop control device of claim 1, constructed for use in the control of an axle of a printing machine.

11. A closed-loop control method for a system to be controlled, wherein the system to be controlled comprises a front node, a back node, an external tapping point arranged between the front and the back node, a controller, a compensating circuit, a measuring device and a setting device, and the compensating circuit comprises an inner node, a frequency filter, a front buffer and a back buffer, said closed-loop control method comprising:

the front node receiving an actual value detected at an output of the system to be controlled by means of the measuring device, and a corresponding desired value, the front node determining a control difference from the difference between the actual value and the corresponding desired value, the back node receiving the control difference and a compensation signal, the back node supplying the controller with an external sum signal formed by adding the control difference and the compensation signal, using the external sum signal, the controller determining a control signal for the system to be controlled the controller outputting the control signal to the system to be controlled, the inner node determining an internal sum signal by adding the control difference tapped at the external tapping point and weighted with a first weighting factor, and a feedback signal weighted with a second weighting factor, the inner node supplying the internal sum signal to the frequency filter, the frequency filter carrying out a frequency filtering, the frequency filter supplying an output filtered signal to the front buffer, the front buffer delaying the output filtered signal by a first propagation delay, the front buffer outputting a correspondingly first delayed signal as an output signal, the back buffer delaying the compensation signal by a second propagation delay, the back buffer outputting a correspondingly second delayed signal as a feedback signal, during normal operation of the closed-loop control method, using the output signal of the front buffer as the compensation signal, while in a setting mode of the closed-loop control method, the setting device automatically suppressing use of the output signal of the front buffer as the compensation signal, supplying the back buffer and the back node with a first excitation signal as the compensation signal instead, detecting a first result signal produced by the first excitation signal, selecting the first result signal from the group consisting of the control difference, the internal sum signal, the output filtered signal of the frequency filter and the output signal of the front buffer, and based on an evaluation of the first excitation signal and the first result signal, setting a parameter of the frequency filter and the second propagation delay.

12. The method of claim 11, wherein during the course of evaluation of the first excitation signal and the first result signal, further comprising the setting device determining a transfer function of a closed-control loop, and the setting device setting the parameter of the frequency filter and the second propagation delay on the basis of an evaluation of the transfer function of the closed-control loop.

13. The method of claim 12, further comprising the setting device determining a plurality of vectors which include as a vector component the parameter of the frequency filter and the second propagation delay in each case, the setting device, using the transfer function for the plurality of vectors, determining a ratio of the output signal of the front buffer to the first excitation signal as a function of a frequency in each case, the setting device setting the parameter of the frequency filter and the second propagation delay according to an optimal vector from the plurality of vectors, which is rated as being optimum according to a predetermined optimization criterion, as a boundary condition to be observed, the predetermined optimization criterion including that the ratio of the output signal of the front buffer to the first excitation signal as a function of the frequency remains below a predetermined threshold which, in turn, is less than 1, and rating the optimal vector the better the higher a limit frequency of the frequency filter is.

14. The method of claim 11, further comprising the setting device determining a lowest absorber frequency of the closed-control loop on the basis of the evaluation of the first excitation signal and the first result signal, and the setting device determining the parameter of the frequency filter in such a way that the limit frequency of the frequency filter matches a predetermined percentage of the lowest absorber frequency.

15. The method of claim 14, wherein at an auxiliary frequency, which is less than the limit frequency of the frequency filter determined using the lowest absorber frequency, the setting device determining a control loop propagation time for the auxiliary frequency, wherein the control loop propagation time is the time that elapses until a signal fed to the front node produces a change in the actual value, and the setting device setting the second propagation delay to the control loop propagation time.

16. The method of claim 11, further comprising the setting device fixing the first weighting factor and the second weighting factor at predetermined values.

17. The method of claim 11, wherein before or after feeding the first excitation signal to the back buffer and the back node, the setting device further suppressing the use of the output signal of the front buffer as the compensation signal, supplying the back buffer and the back node with a second excitation signal as the compensation signal, detecting a second result signal produced thereby, selecting the second result signal now produced from the group consisting of the control difference now produced, the internal sum signal now produced, the output filtered signal now produced of the frequency filter and the output signal now produced of the front buffer, and on the basis of an evaluation of the first excitation signal and the first result signal produced as a result on the one hand and the second excitation signal and the second result signal produced as a result on the other hand, the setting device deciding whether to set the parameter of the frequency filter and the second propagation delay.

18. The method of claim 11, wherein the system to be controlled further comprises a monitoring system, during normal operation of the closed-loop control method, the monitoring system automatically monitoring a time characteristic of the compensation signal, and the monitoring system suppressing a feeding of the output signal of the front buffer to the back node and/or setting the parameter of the frequency filter and/or the second propagation delay to different values as soon as the monitoring of the time characteristic of the compensation signal demonstrates an instability of the compensating circuit.

19. The method of claim 11, wherein the closed-loop control method is designed as a software-programmable closed-loop control method and is programmed with a software module.

20. The method of claim 11, wherein the closed-loop control method is used to control an axle of a printing machine.

* * * * *